(12) United States Patent
Landgraf et al.

(10) Patent No.: US 9,166,039 B2
(45) Date of Patent: Oct. 20, 2015

(54) LATERAL TRANSISTOR COMPONENT AND METHOD FOR PRODUCING SAME

(71) Applicant: Infineon Technologies AG, Neubiberg (DE)

(72) Inventors: Erhard Landgraf, Dresden (DE); Thomas Bertrams, Dresden (DE); Claus Dahl, Dresden (DE); Henning Feick, Dresden (DE); Andreas Pribil, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/321,302

(22) Filed: Jul. 1, 2014

(65) Prior Publication Data

US 2014/0339634 A1   Nov. 20, 2014

Related U.S. Application Data

(63) Continuation of application No. 13/707,386, filed on Dec. 6, 2012, now Pat. No. 8,809,952.

(30) Foreign Application Priority Data

Dec. 6, 2011   (DE) .............................. 102011087845

(51) Int. Cl.
*H01L 29/78* (2006.01)
*H01L 21/02* (2006.01)
(Continued)

(52) U.S. Cl.
CPC ...... *H01L 29/7816* (2013.01); *H01L 21/02107* (2013.01); *H01L 21/0334* (2013.01); *H01L 21/266* (2013.01); *H01L 29/0649* (2013.01); *H01L 29/0882* (2013.01); *H01L 29/1095* (2013.01); *H01L 29/401* (2013.01); *H01L 29/402* (2013.01); *H01L 29/4238* (2013.01);
(Continued)

(58) Field of Classification Search
None
See application file for complete search history.

(56) References Cited

U.S. PATENT DOCUMENTS

| 5,089,871 A | 2/1992 | Fujihara |
| 6,118,152 A | 9/2000 | Yamaguchi et al. |

(Continued)

FOREIGN PATENT DOCUMENTS

| DE | 102006033692 A1 | 1/2008 |
| JP | 2002314065 A | 10/2002 |

(Continued)

OTHER PUBLICATIONS

Lin, D-G., et al., "A Novel LDMOS Structure With A Step Gate Oxide," International Electron Devices Meeting, Conference Publications, Dec. 10-13, 1995, pp. 963-966.

*Primary Examiner* — Joseph Schoenholtz
(74) *Attorney, Agent, or Firm* — Slater & Matsil, L.L.P.

(57) ABSTRACT

A transistor component includes an active transistor region arranged in the semiconductor body. And insulation region surrounds the active transistor region in the semiconductor body in a ring-shaped manner. A source zone, a drain zone, a body zone and a drift zone are disposed in the active transistor region. The source zone and the drain zone are spaced apart in a lateral direction of the semiconductor body and the body zone is arranged between the source zone and the drift zone and the drift zone is arranged between the body zone and the drain zone. A gate and field electrode is arranged over the active transistor region. The dielectric layer has a first thickness in a region near the body zone and a second thickness in a region near the drift zone.

26 Claims, 9 Drawing Sheets

(51) Int. Cl.

| | |
|---|---|
| *H01L 29/66* | (2006.01) |
| *H01L 21/033* | (2006.01) |
| *H01L 21/266* | (2006.01) |
| *H01L 29/40* | (2006.01) |
| *H01L 29/423* | (2006.01) |
| *H01L 29/739* | (2006.01) |
| *H01L 29/10* | (2006.01) |
| *H01L 29/45* | (2006.01) |
| *H01L 29/49* | (2006.01) |
| *H01L 29/06* | (2006.01) |
| *H01L 29/08* | (2006.01) |

(52) U.S. Cl.
CPC .... *H01L 29/42368* (2013.01); *H01L 29/66325* (2013.01); *H01L 29/66659* (2013.01); *H01L 29/66681* (2013.01); *H01L 29/7393* (2013.01); *H01L 29/7835* (2013.01); *H01L 29/0692* (2013.01); *H01L 29/0847* (2013.01); *H01L 29/456* (2013.01); *H01L 29/4933* (2013.01); *H01L 29/665* (2013.01)

(56) References Cited

U.S. PATENT DOCUMENTS

| | | | |
|---|---|---|---|
| 6,441,431 | B1 | 8/2002 | Efland et al. |
| 7,671,411 | B2 | 3/2010 | You et al. |
| 7,737,494 | B2 | 6/2010 | Tanaka |
| 8,039,323 | B2 | 10/2011 | Tanaka |
| 8,598,000 | B2 | 12/2013 | Zuniga |
| 8,698,236 | B2 * | 4/2014 | Takeda et al. .................. 257/335 |
| 8,809,952 | B2 * | 8/2014 | Landgraf et al. ............... 257/339 |
| 2002/0072159 | A1 * | 6/2002 | Nishibe et al. ................. 438/179 |
| 2002/0145172 | A1 | 10/2002 | Fujishima et al. |
| 2003/0141559 | A1 | 7/2003 | Moscatelli et al. |
| 2007/0063271 | A1 | 3/2007 | Takimoto et al. |
| 2010/0301411 | A1 | 12/2010 | Takeda et al. |
| 2011/0241112 | A1 | 10/2011 | Zuniga |
| 2013/0214355 | A1 * | 8/2013 | Fang et al. ..................... 257/343 |
| 2014/0167159 | A1 * | 6/2014 | Takeda et al. .................. 257/343 |

FOREIGN PATENT DOCUMENTS

| | | |
|---|---|---|
| WO | 2004090973 A1 | 10/2004 |
| WO | 2011054670 A1 | 5/2011 |

* cited by examiner

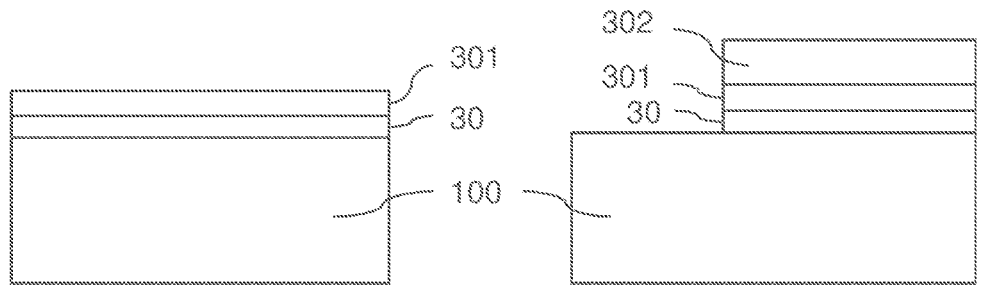
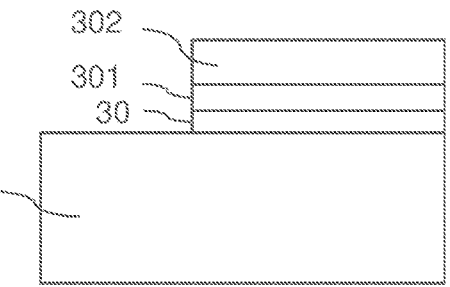
FIG 10A
FIG 10B
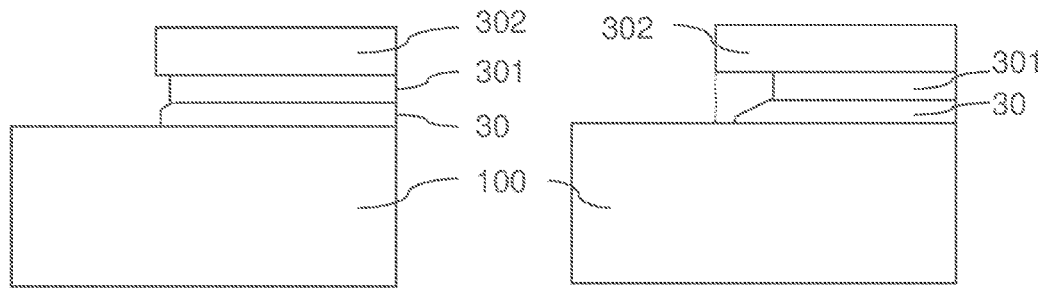
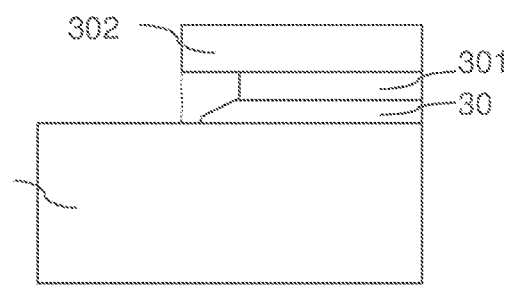
FIG 10C
FIG 10D
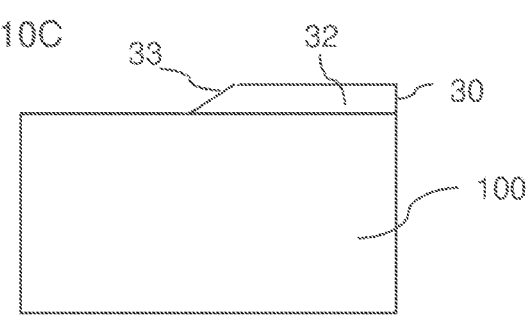
FIG 10E

LATERAL TRANSISTOR COMPONENT AND METHOD FOR PRODUCING SAME

This application is a continuation of Ser. No. 13/707,386 filed on Dec. 6, 2012, which claims priority to German Patent Application 10 2011 087 845.9, which was filed Dec. 6, 2011, and are both incorporated herein by reference.

TECHNICAL FIELD

The present invention relates to a lateral transistor component, in particular a lateral MOS transistor component comprising a field electrode or field plate, and a method for producing a lateral transistor component.

BACKGROUND

An example of a lateral transistor component is described, for example, in Lin, et al., "A Novel LDMOS Structure With A Step Gate Oxide," IEDM 95, pages 963-964.

SUMMARY OF THE INVENTION

In one aspect, the present invention provides a transistor component, in particular a lateral transistor component, comprising a gate electrode and a field electrode, which component is shielded well externally, and a method for producing such a transistor component. It is furthermore an object of the invention to provide a method for producing a dielectric whose thickness increases continuously in sections.

A first exemplary embodiment of the invention relates to a transistor component comprising a semiconductor body, an active transistor region arranged in the semiconductor body, and an insulation region surrounding the active transistor region in the semiconductor body in a ring-shaped manner. The transistor component additionally comprises a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone. The component additionally comprises a gate and field electrode, wherein the gate and field electrode is arranged above the active transistor region, overlaps the insulation region at least in the region of the drain zone and is insulated from the active transistor region by a dielectric layer, which has in the region of the body zone a first thickness and in the region of the drift zone in sections a second thickness, which is greater than the first thickness, and wherein the gate and field electrode has a first contact opening above the drain zone. The transistor component additionally comprises a drain electrode making contact with the drain zone through the second contact opening.

A further exemplary embodiment relates to a transistor component comprising a semiconductor body, an active transistor region arranged in the semiconductor body, an insulation region surrounding the active transistor region in the semiconductor body in a ring-shaped manner, a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone. The component additionally comprises a gate and field electrode, wherein the gate and field electrode is arranged above the active transistor region, and is insulated from the active transistor region by a dielectric layer, which has in the region of the body zone a first thickness and in the region of the drift zone in sections a second thickness, which is greater than the first thickness, and wherein the dielectric layer has a transition region in which the thickness increases from the first thickness to the second thickness and in which the dielectric layer is inclined at least in sections at an angle of less than 90° relative to a side of the semiconductor body.

One exemplary embodiment of a method according to the invention for producing a transistor component provides producing a semiconductor body having an active transistor region, in which a body zone and a drift zone are arranged, and having an insulation region surrounding the active transistor region in the semiconductor body in a ring-shaped manner; producing a dielectric layer having in the region of the body zone a first thickness and in the region of the drift zone in sections a second thickness, which is greater than the first thickness; producing a gate and field electrode on the dielectric layer in such a way that the gate and field electrode overlaps the insulation region; producing a first contact opening in the gate and field electrode above the drift zone; producing a source zone by introducing dopant atoms into the body zone and producing a drain zone by introducing dopant atoms into the drift zone via the first contact opening; producing a source electrode making contact with the source zone and the body zone, and producing a drain electrode making contact with the drain zone in the second contact opening.

A method for producing a dielectric layer which runs obliquely in sections in accordance with one exemplary embodiment of the invention provides: producing a first dielectric layer; producing a first mask layer on the first dielectric layer; producing a second mask layer on the first mask layer; removing in sections the first dielectric layer and the first mask layer using the second mask layer as a mask, such that a layer stack comprising the first dielectric layer, the first mask layer and the second mask layer arises, which has a side on which the first dielectric layer and the first mask layer are exposed; carrying out an isotropic etching process in the region of the side of the layer stack, by means of which the first dielectric layer and the first mask layer are etched, wherein the first dielectric layer has a lower etching rate than the first mask layer, such that an obliquely running edge of the first dielectric layer arises. The method additionally provides removing the first and second mask layers.

BRIEF DESCRIPTION OF THE DRAWINGS

Exemplary embodiments of the present invention are explained in greater detail below with reference to drawings. The drawings serve for elucidating the basic principle, and so only those features which are necessary for understanding the basic principle are illustrated. The drawings are not true to scale. In the drawings, unless indicated otherwise, identical reference signs designate identical features.

FIG. 1, which includes

FIG. 2, which includes

FIG. 9, which includes FIG. 10, which includes FIGS. 10A to 10E, illustrates a method for producing a dielectric layer having an obliquely running edge.

DETAILED DESCRIPTION OF ILLUSTRATIVE EMBODIMENTS

Figure 1A:
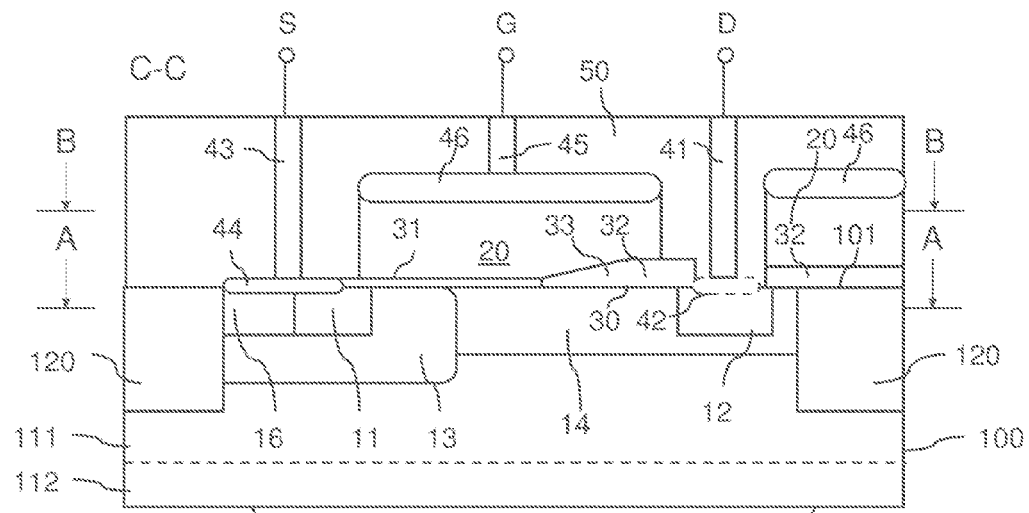
FIGS. 1A to 1C, illustrates a first exemplary embodiment of a lateral transistor component on the basis of a vertical cross-sectional illustration (FIG. 1A) and on the basis of two horizontal cross-sectional illustrations (FIGS. 1B and 1C)
Figure 1B:
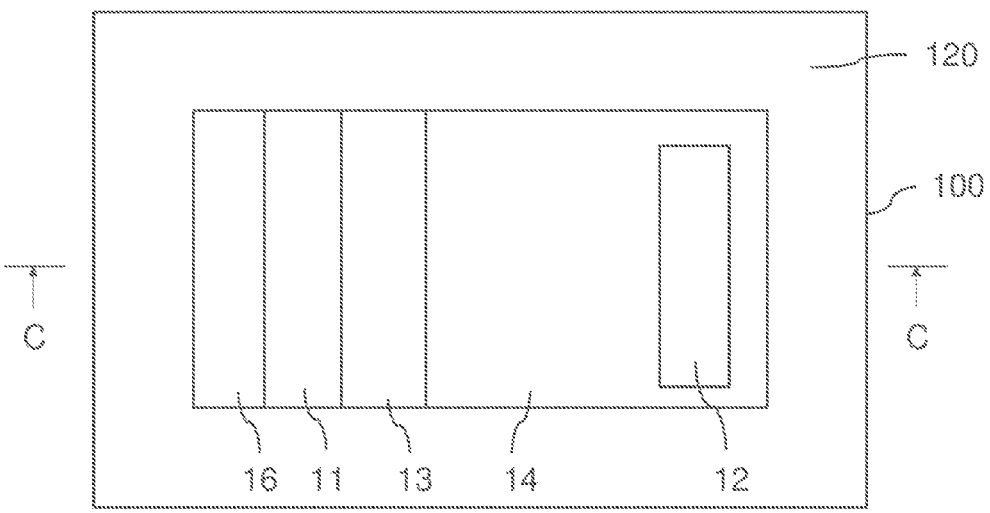
Figure 1C:
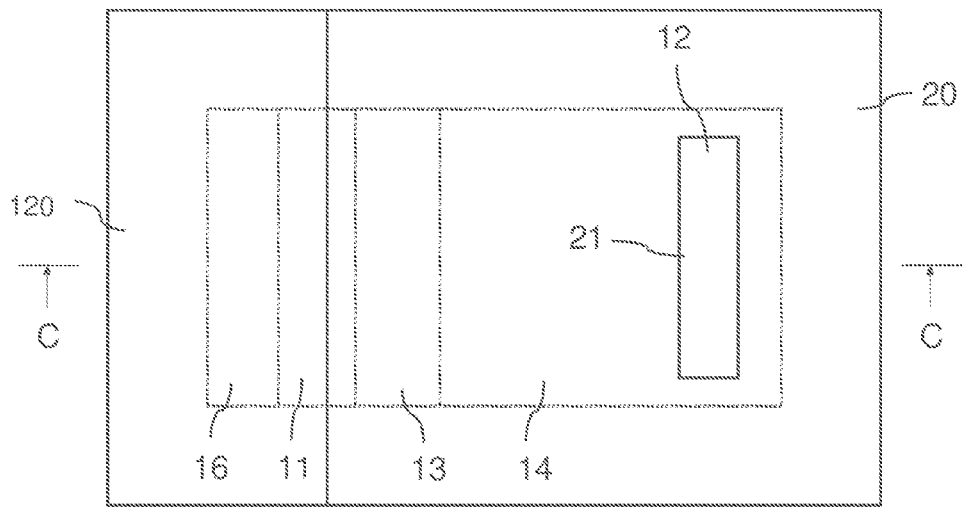

FIGS. 1A to 1C illustrate a first exemplary embodiment of a lateral transistor component according to the invention. FIG. 1A illustrates a vertical cross section through the transistor component, FIG. 1B illustrates a horizontal cross section in a sectional plane A-A illustrated in FIG. 1A, and FIG. 1C illustrates a horizontal cross section in a sectional plane B-B illustrated in FIG. 1A. The vertical cross section in accordance with FIG. 1A is a cross section in a vertical sectional plane C-C illustrated in FIGS. 1B and 1C.

Referring to FIGS. 1A and 1B, the transistor component comprises a semiconductor body 100, an active transistor region 110 arranged in the semiconductor body 100, and an insulation region 120 surrounding the active transistor region in the semiconductor body 100 in a ring-shaped manner. The ring-shaped course of the insulation region 120 can be seen in particular with reference to FIG. 1B. The cross section (in the sectional plane A-A) illustrated there runs through the insulation region 120 and the active transistor region 110. The active transistor region 110 of the lateral transistor component is a semiconductor region of the semiconductor body 100 in which active transistor areas (which will be explained below) of the lateral transistor component are arranged.

The insulation region 120 comprises, for example, a trench which runs in a ring-shaped manner and in which an insulation material, such as an oxide, for example, is arranged. The insulation region 120 is, for example, an STI region (STI=Shallow Trench Isolation) or a LOCOS region (LOCOS=Local Oxidation of Silicon). In the exemplary embodiment illustrated in FIG. 1B, the active transistor region 110 has a rectangular cross section in the horizontal plane of the semiconductor body 100. However, this is merely an example; the active transistor region 110 could also have a different geometry than a rectangular geometry.

The semiconductor body 100 can comprise of a conventional semiconductor material such as, for example, silicon (Si), silicon carbide (SiC), gallium arsenide (GaAs), etc. In accordance with one exemplary embodiment, the semiconductor body 100 has, in the regions adjoining the insulation region 120 and adjoining active transistor areas, a basic doping having a doping concentration of, for example, between $1e15$ cm$^{-3}$ and $1e16$ cm$^{-3}$, in particular in the region of $8e15$ cm$^{-3}$.

Referring to FIGS. 1A and 1B, the transistor component comprises in the active transistor region 110 a source zone 11, a drain zone 12 spaced apart from the source zone 11 in a lateral direction of the semiconductor body, a body zone 13 and a drift zone 14. The body zone 13 is arranged between the source zone 11 and the drift zone 14, and the drift zone 14 is arranged between the body zone 13 and the drain zone 12. There is a pn junction present between the body zone 13 and the drift zone 14. In accordance with one exemplary embodiment (illustrated by dashed lines), provision is made for the semiconductor body to have, below the body region 13 and the drift zone, a semiconductor zone 111 of the conduction type of the body zone 13, which semiconductor zone is more lightly doped, however, and forms a pn junction with an underlying and complementarily doped semiconductor zone 112. The pn junction provides for a junction insulation of the lateral transistor component from other components (not illustrated) integrated in the semiconductor body.

In accordance with another example (not illustrated), the active component region 110 is arranged on an insulation layer in an SOI substrate. The insulation layer in this case provides for an insulation from other components. In this case, the insulation region can extend as far as the insulation layer.

The lateral transistor component can be embodied as an n-conducting component or as a p-conducting component. In the case of an n-conducting component, the source zone 11 and the drift zone 14 are n-doped, while the body zone 13 is p-doped. In the case of a p-conducting component, the source zone 11 and the drift zone 14 are p-doped, while the body zone 13 is n-doped. The transistor component can be embodied as a MOSFET or as an IGBT.

In the case of a MOSFET, the drain zone 12 is of the same conduction type as the source zone 11 and the drift zone 14. In the case of an IGBT, the drain zone is doped complementarily to the source zone 11 and the drift zone 14. In the case of an IGBT, the drain zone 12 is also designated as the emitter zone. The transistor component can be embodied as a normally off component. In this case, the body zone 13 extends as far as a dielectric layer 30, which will be explained below. Furthermore, the transistor component can also be embodied as a normally on component. In this case, the body zone 13 has along the dielectric layer 30 a channel zone (not illustrated) of the same conduction type as the source zone 11.

The lateral direction of the semiconductor body 100 in which the source zone 11 and the drain zone 12 are spaced apart is designated hereinafter as the first lateral direction or current flow direction of the transistor component. Referring to FIG. 1B, the source zone 11, the body zone 13 and the drift zone 14 can extend as far as the insulation region 120 in a direction transversely or perpendicularly with respect to the first lateral direction or current flow direction, while the drain zone 12 can be spaced apart from the insulation region 120 in the current flow direction and transversely with respect to the current flow direction. In this case, there is arranged between the drain zone 12 and the insulation region a section of the drift zone 14 or a semiconductor zone which corresponds to the drift zone 14 with regard to its doping.

Referring to FIG. 1A, the lateral transistor component comprises a gate and field electrode 20, which is arranged above a first side (front side) 101 of the semiconductor body 100 and which is dielectrically insulated from the active transistor region 110 by a dielectric layer 30. The gate and field electrode 20 acts as a gate electrode where it is arranged above the body zone 13, and serves for controlling a conducting channel in the body zone 13 between the source zone 11 and the drift zone 14 in this region. In the remaining regions, that is to say for example where the gate and field electrode 20 is arranged above the drift zone 14, the gate and field electrode acts as a field electrode and serves for influencing the profile of an electric field in the active transistor region 110 when the component is in the off state, as a result of which an increased robustness or dielectric strength of the component is achieved. In the on state, the field electrode causes an accumulation channel to be produced in the drift zone 14 along the dielectric layer 30 and thus provides for a low on resistance of the component. The transistor component can be operated like a conventional MOSFET or IGBT, i.e., can be driven in the on state or off state by a suitable potential being applied to the gate and field electrode 20.

The dielectric layer has a first thickness d1 at least above the body zone 13, that is to say where the gate and field electrode 20 acts as a gate electrode. The dielectric layer 30 acts as a gate dielectric 31 in this region. The thickness of the gate dielectric 31 is between 5 nm and 50 nm, for example. In a section above the drift zone 14 and above the drain zone 12 where the gate and field electrode 20 acts as a field electrode, the dielectric layer 30 has a second thickness d2, which is thicker than the first thickness d1. The second thickness d2 is between 40 nm and 500 nm, for example.

That region of the dielectric layer 30 in which the latter has the second thickness d2 is designated by the reference sign 32 in FIG. 1A. The dielectric layer 30 in the region is designated hereafter as the field electrode dielectric.

The dielectric layer 30 additionally has a transition region 33 in which the thickness increases from the first thickness d1 to the second thickness d2. In the case of the exemplary embodiment illustrated in FIG. 1A, this increase in thickness takes place continuously, i.e., there is no stepwise increase in the thickness of the dielectric layer 30. The inclination in the transition region 33 is, for example, between 5° and 60°, in particular between 20° and 40°, relative to the front side 101 of the semiconductor body 100.

Referring to FIG. 1A and referring to FIG. 1C, showing a horizontal cross section through the gate and field electrode 20, the gate and field electrode 20 covers the active transistor region 110 in sections and overlaps the insulation region 120 at least in the region of the drain zone 12. In the example illustrated, the gate and field electrode 20 extends in the current flow direction from the source zone 11, which it overlaps, as far as above the insulation region 120. Transversely with respect to the current flow direction, the gate and field electrode 20 likewise extends as far as above the insulation region. The gate and field electrode 20 thus covers the entire drift zone 14, including that section of the drift zone 14 which is arranged between the drain zone 12 and the insulation region 120. Above the drain zone 12, the gate and field electrode 20 has a first contact hole 21. The drain zone 12 is electrically connected to a drain electrode 41 arranged in the first contact hole 21. The drain electrode 41 forms a drain connection D of the transistor component or is connected thereto.

The source zone 11 is electrically connected to a source electrode 43. The source electrode 43 forms a source connection S of the component or is connected thereto. The source electrode 43 and the drain electrode 41 are electrically insulated from the gate and field electrode 20 by an insulation layer 50. Referring to FIG. 1A, the body zone 13 can also be electrically connected to the source electrode 43. For this purpose, the body zone 13 has a connection region 16 of the same conduction type as the body zone 13, the connection region being doped more highly than the body zone 13. A contact electrode 44 can be arranged between the source electrode 43 and the source zone 11 and the connection region 16, the contact electrode making electrical contact with the source zone 11 and the connection region 16. The contact electrode 44 consists, for example, of a metal-semiconductor compound, that is to say a silicide in the case of a semiconductor body 100 composed of silicon. The silicide is, for example, a cobalt silicide, a titanium silicide, etc. The drain electrode 41 can be directly connected to the drain zone 12. Optionally, a contact electrode 42 is likewise arranged between the drain electrode 41 and the drain zone 12, the contact electrode for example likewise consisting of a metal-semiconductor compound, such as a silicide, for example.

Referring to FIG. 1A, the gate and field electrode 20 is connected to a gate connection electrode 45, which makes contact with the gate and field electrode 20 via a contact electrode 46 in the exemplary embodiment illustrated.

Referring to FIG. 1C, the first contact opening 21 is spaced apart from the insulation region 120 in the horizontal direction of the semiconductor body 100, such that the gate and field electrode 20 covers a transition region between the active transistor region 110 and the insulation region 120 at least in the region of the drain zone 12.

The position of the gate and field electrode 20 can be seen in particular with reference to FIG. 1C. The position of the drift zone 14, the position of the body zone 13 and the position of the regions of the source zone 11 which are covered by the gate and field electrode are illustrated by dotted lines in FIG. 1C. The drain zone 12—depending on the production method—can be smaller, larger or equal to a horizontal cross section of the first contact hole 21.

Figure 2A:
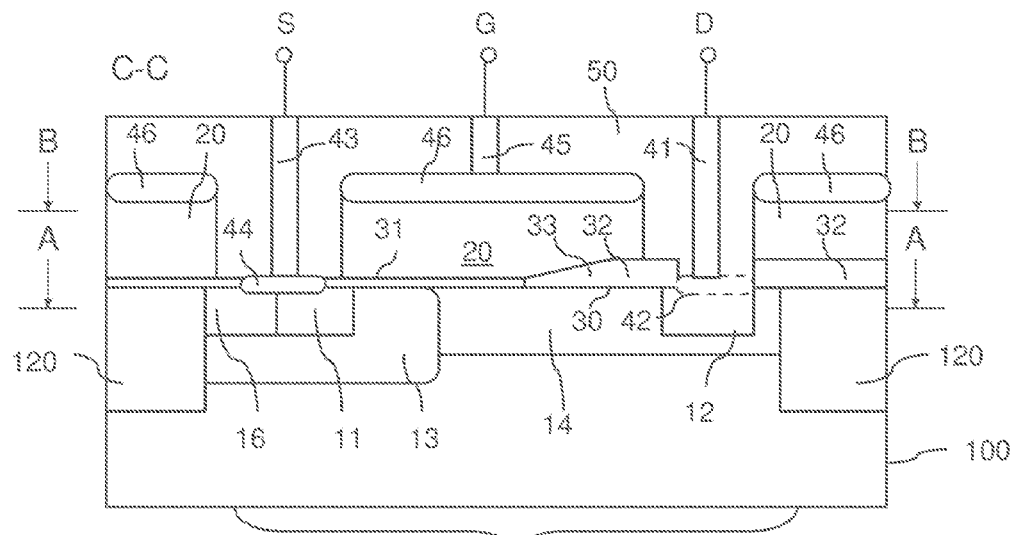
FIGS. 2A to 2C, illustrates a second exemplary embodiment of a lateral transistor component on the basis of a vertical cross-sectional illustration (FIG. 2A) and on the basis of two horizontal cross-sectional illustrations (FIGS. 2B and 2C)
Figure 2B:
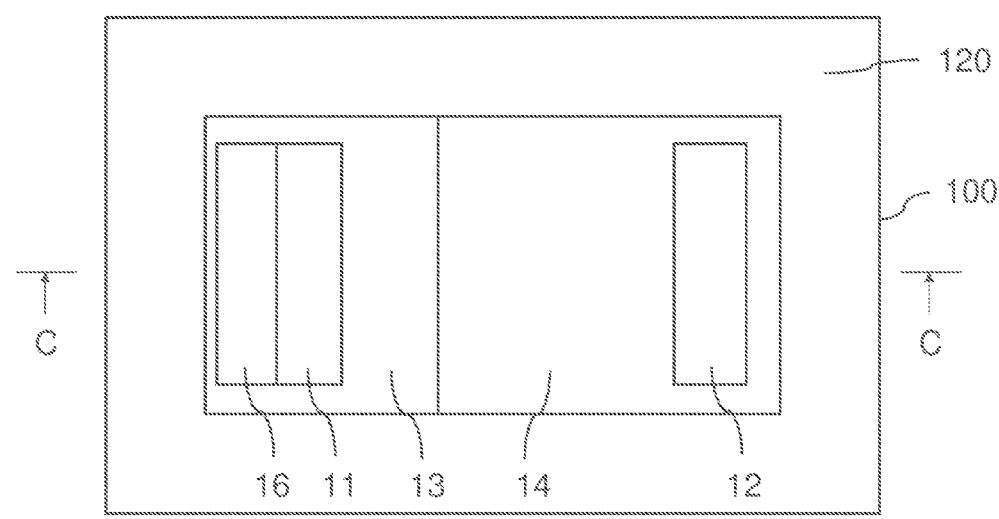
Figure 2C:
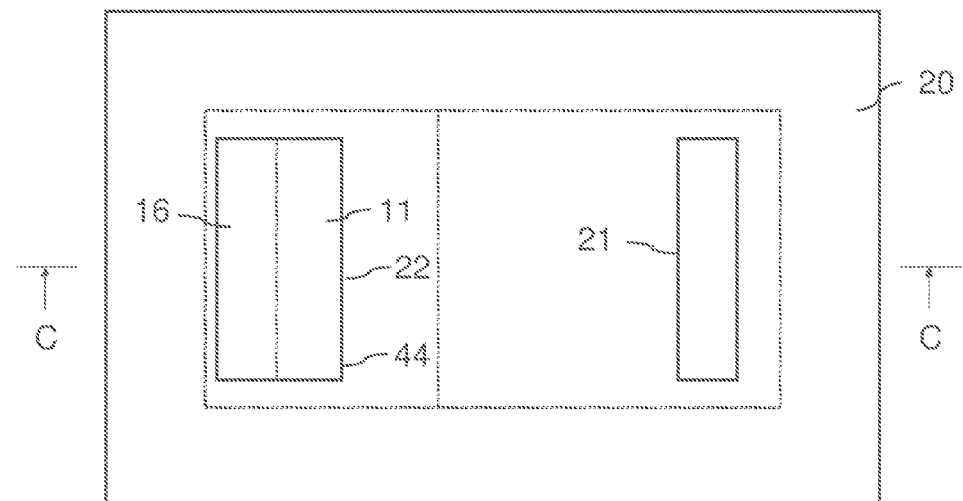

FIGS. 2A to 2C illustrate, on the basis of a vertical cross-sectional illustration (FIG. 2A) and on the basis of two horizontal cross-sectional illustrations (FIGS. 2B and 2C), a modification of the component illustrated above with reference to FIGS. 1A to 1C. The position of the sectional planes in accordance with FIGS. 2A to 2C corresponds to the position of the sectional planes in accordance with FIGS. 1A to 1C. The component in accordance with FIGS. 2A to 2C differs from the component in accordance with FIGS. 1A to 1C in that, in the case of the component in accordance with FIGS. 2A to 2C, the gate and field electrode 20 extends in all directions as far as above the insulation region and, above the source zone 11, has a second contact opening 22, on which the source electrode 43 is arranged. Referring to FIG. 2B, the source zone 11 and the contact region are spaced apart from the insulation region 120 in the case of this exemplary embodiment.

Figure 3:
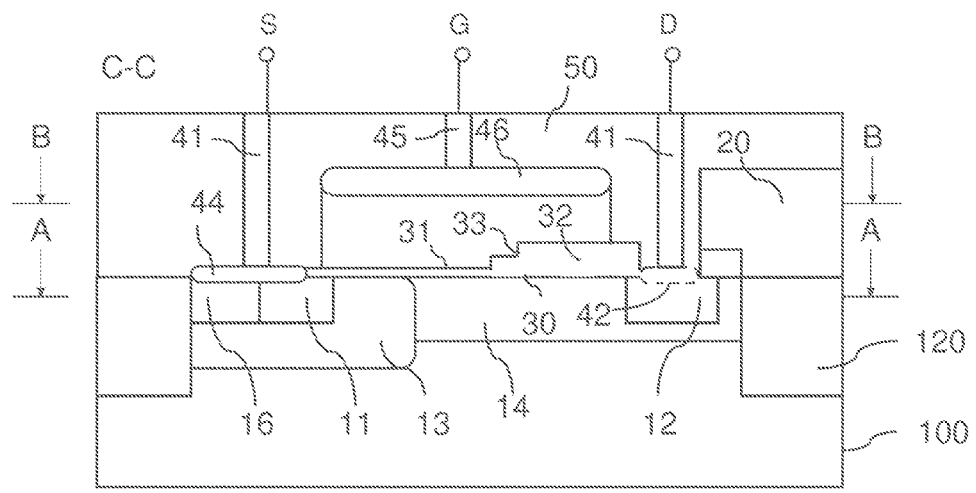
FIG. 3 illustrates a vertical cross-sectional illustration of a lateral transistor component in accordance with a third exemplary embodiment.

FIG. 3 shows a further exemplary embodiment of a lateral transistor component on the basis of a vertical cross section. This component differs from the component in accordance with FIG. 1A in that the transition region 33 runs in a stepped fashion. In this case, the transition region has at least one step or, as illustrated in FIG. 3, a plurality of steps.

Figure 4:
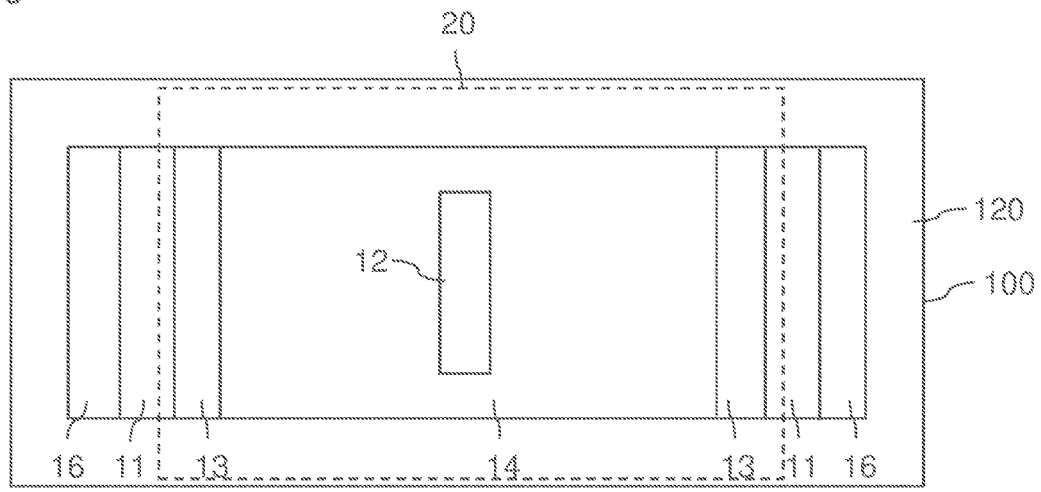
FIG. 4 illustrates a horizontal cross-sectional illustration of a lateral transistor component in accordance with a fourth exemplary embodiment.

FIG. 4 shows a horizontal sectional illustration of a lateral transistor component in accordance with a further exemplary embodiment. The sectional plane illustrated corresponds to the sectional plane B-B in accordance with the figures explained previously. In the case of the component in accordance with FIG. 4, in each case two source zones 11 and two body zones 13 in the active transistor region are arranged symmetrically with respect to the drain zone 12 and connected to a common source connection (not illustrated). The gate and field electrode 20, the position of which is illustrated by dashed lines in FIG. 4, has the first contact hole above the drain zone and extends in the current flow direction from one source zone 11 to the other source zone 11 and extends transversely with respect to the current flow direction as far as above the insulation region 120. The gate and field electrode covers the drift zone 14 completely—apart from possibly in the region of the first contact hole 21. The drain zone 12 is spaced apart from the insulation region 120. The component in accordance with FIG. 4 is a variant of the component in accordance with FIGS. 1A to 1C which is obtained by mirroring the component structure illustrated in FIGS. 1A to 1C at the drain zone 12 (in a mirror plane running transversely with respect to the current flow direction).

Figure 5:
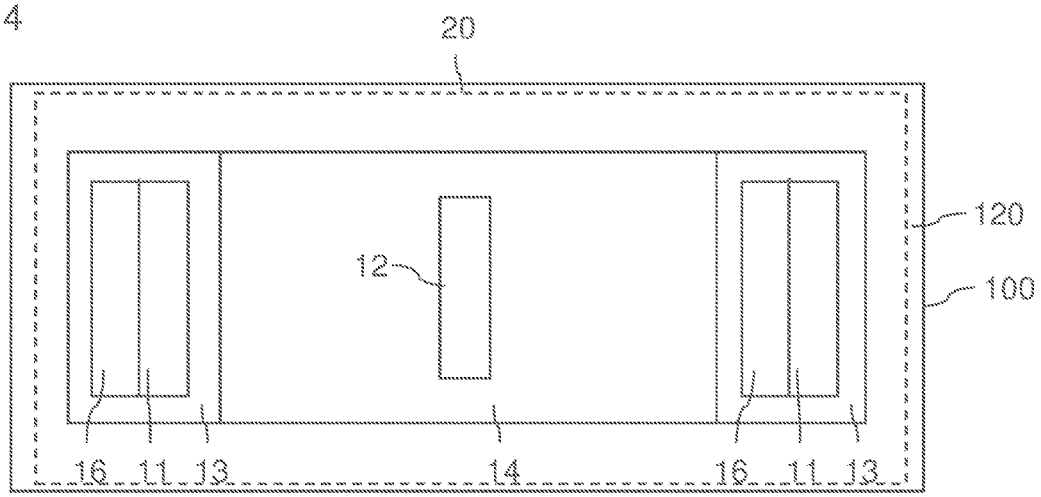
FIG. 5 illustrates a horizontal cross-sectional illustration of a lateral transistor component in accordance with a fifth exemplary embodiment.

FIG. 5 shows a horizontal cross section of a component obtained by mirroring the component structure illustrated in FIGS. 2A to 2C at the drain zone 12. This component differs from the component illustrated in FIG. 4 in that the active transistor region 110 is covered by the gate and field electrode 20 completely apart from in the region of the first contact opening and in the region of two second contact openings above the source zones 11, the position of the gate and field electrode being illustrated by dashed lines in FIG. 5.

Figure 6:
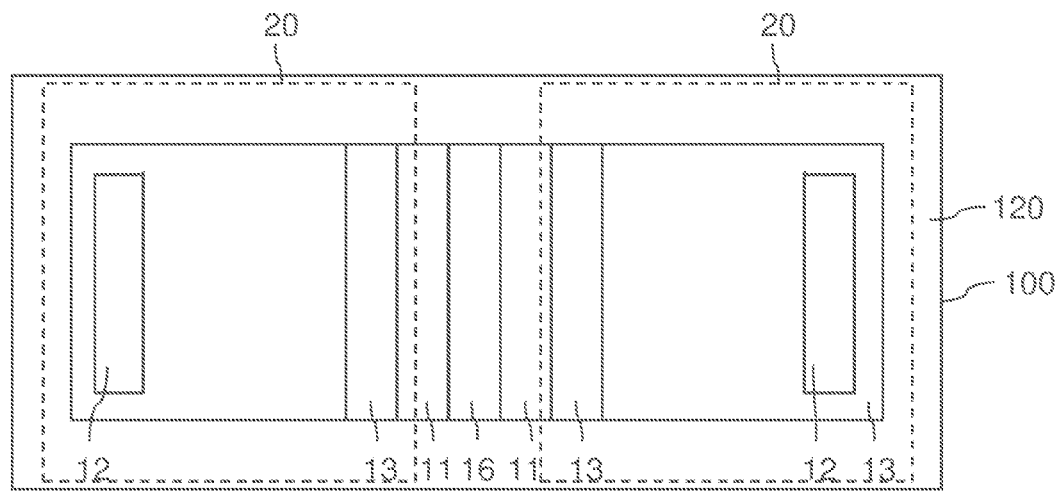
FIG. 6 illustrates a horizontal cross-sectional illustration of a lateral transistor component in accordance with a sixth exemplary embodiment.

FIG. 6 shows a horizontal cross section of a component obtained by mirroring the component structure illustrated in FIGS. 1A to 1C at the contact zone 16 of the body zone 13. This component therefore comprises two drain zones 12 and also two source zones 11, which are in each case situated symmetrically with respect to the contact zone 16. Moreover, two gate and field electrodes 20 are present. In this case, the drain zones 12 are connected to a common drain connection (not illustrated), the source zones 11 are connected to a common source connection (not illustrated), and the gate and field electrodes 20 are connected to a common gate connection (not illustrated).

Figure 7:
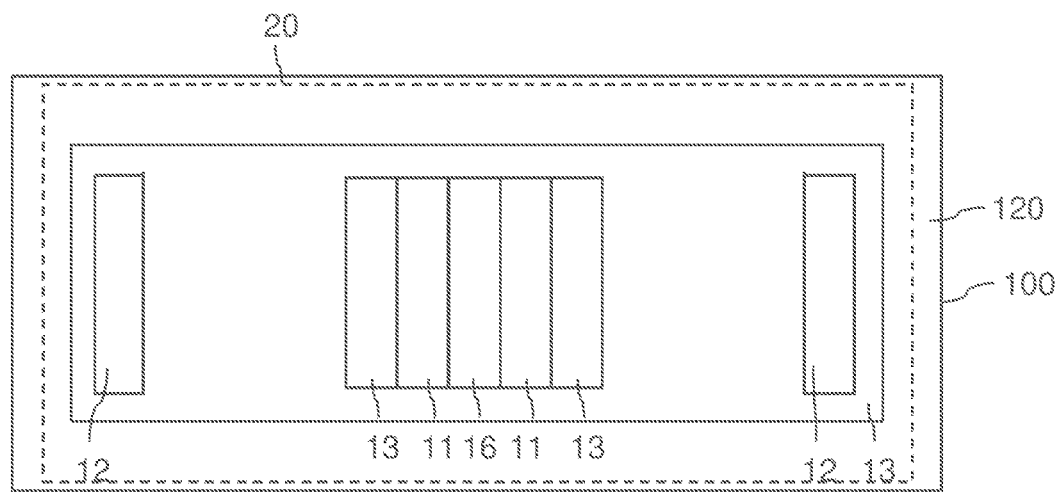
FIG. 7 illustrates a horizontal cross-sectional illustration of a lateral transistor component in accordance with a seventh exemplary embodiment.

FIG. 7 shows a horizontal cross section of a component obtained by mirroring the component structure illustrated in FIGS. 2A to 2C at the contact zone 16 of the body zone 13. This component therefore comprises two drain zones 12 and also two source zones 11, which are in each case situated symmetrically with respect to the contact zone 16. In this case, the drain zones 12 are connected to a common drain connection (not illustrated) and the source zones 11 are connected to a common source connection (not illustrated). This component differs from the component illustrated in FIG. 6 in that the active transistor region 110 is covered by the gate and field electrode 20 completely apart from in the region of the first contact opening and in the region of a second contact opening above the source zones 11 and the contact zone 16, the position of the gate and field electrode being illustrated by dashed lines in FIG. 7.

Figure 8:
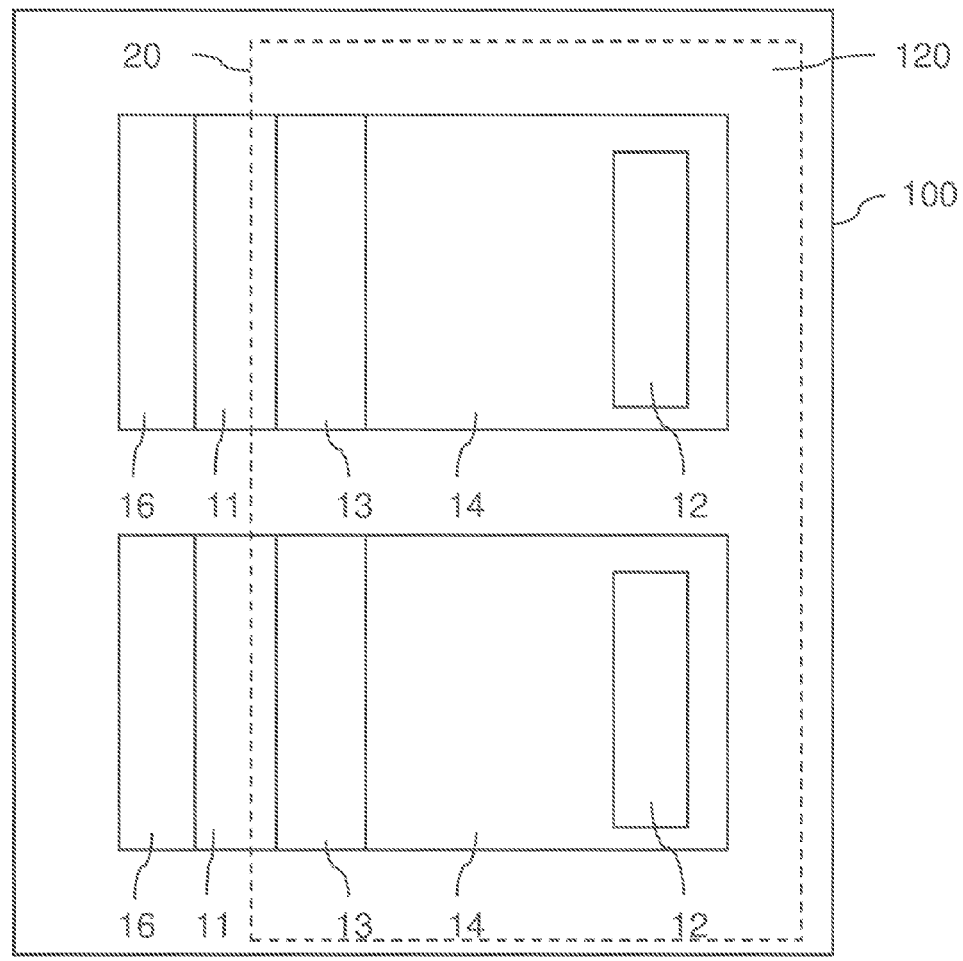
FIG. 8 illustrates a horizontal cross-sectional illustration of a lateral transistor component in accordance with an eighth exemplary embodiment.

FIG. 8 shows a further exemplary embodiment of a lateral transistor component on the basis of a horizontal cross section in a sectional plane corresponding to the sectional plane C-C. This component comprises two transistor structures in accordance with FIGS. 1A to 1C, which have a common gate and field electrode 20 (illustrated by dashed lines). In this case, the drain zones 12 are connected to a common drain connection (not illustrated) and the source zones 11 are connected to a common source connection (not illustrated).

It goes without saying that there is also the possibility of providing a multiplicity of the previously explained transistor structures in a semiconductor body and connecting these individual structures in parallel by connecting the source zones of the individual transistor structures to one another, by connecting the drain zones of the individual transistor structures to one another and by connecting the gate and field electrodes to one another, or by providing a common gate and field electrode for all of the transistor structures.

One exemplary embodiment of a method for producing a lateral transistor component in accordance with FIG. 1 is described below with reference to FIGS. 9A to 9I. These figures in each case show vertical cross sections through the semiconductor body 100 and the structures applied thereon during individual method steps of the production method.

Figure 9A:
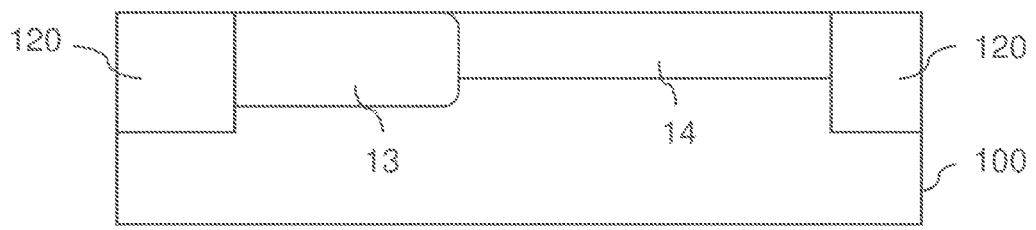
FIGS. 9A to 9I, illustrates a method for producing a lateral transistor component on the basis of vertical cross-sectional illustrations.
Figure 9B:
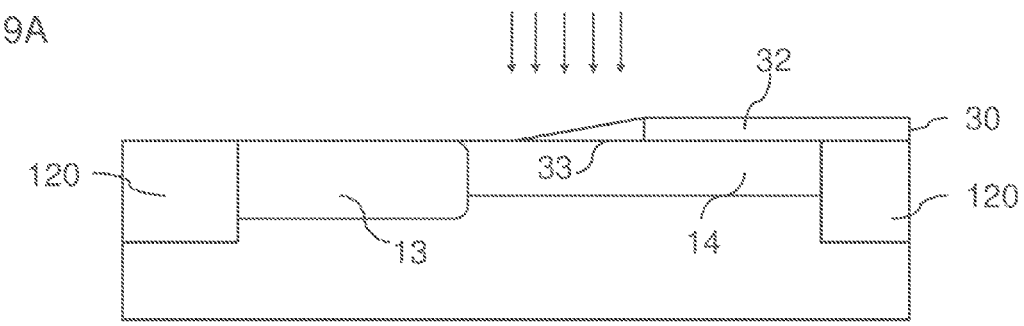

Referring to FIG. 9A, the method firstly provides for providing a semiconductor body 100 having an active transistor region 110, in which a body zone 13 and a drift zone 14 are arranged, and having an insulation region 120 surrounding the active transistor region 110 in a ring-shaped manner. The insulation region 120 can be produced, for example, by etching a ring-shaped trench into the first surface 101 of the semiconductor body 100 and by filling the trench with an insulation material, such as an oxide, for example. The production of the body zone 13 and of the drift zone 14 in the active transistor region 110 can be effected by means of conventional implantation and/or diffusion methods. In order to produce the drift zone 14, in this case dopant atoms of the first conduction type are introduced into the active transistor region 110 and, in order to produce the body zone 13, dopant atoms of the second conduction type are introduced into the active transistor region 110.

Figure 9C:
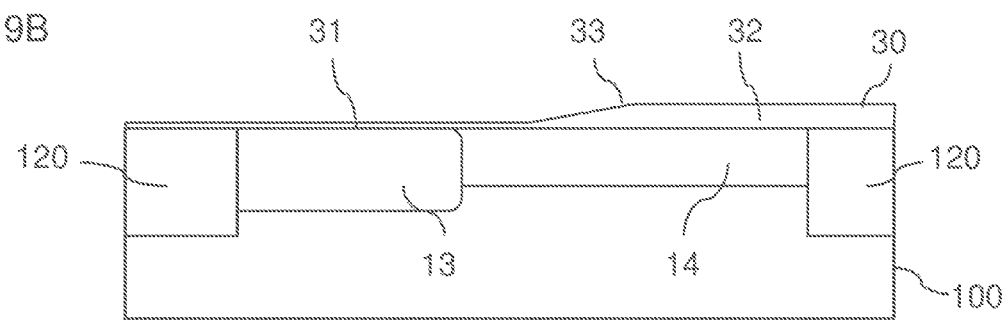

In the next method steps, the result of which is illustrated in FIG. 9C, the dielectric layer 30 is produced on the first surface 101 of the semiconductor body 100. The production of the dielectric layer 30 can comprise, referring to FIG. 9B, firstly the production of the thicker field plate dielectric 32 and of the obliquely running transition region 33 and subsequently, as illustrated as the result in FIG. 9C, the production of the thinner gate dielectric 31. A method for producing the field plate dielectric 32 having the obliquely running transition region 33 will be explained below with reference to FIGS. 10A to E.

Instead of a dielectric layer 30 having a transition region 33 in which the thickness increases continuously from the thickness d1 to the second thickness d2, the dielectric layer 30 could also be realized with a stepped transition region. This stepped transition region can comprise one step or else a plurality of steps, as illustrated in FIG. 2.

The drift zone 14 is produced, for example, firstly such that it has a homogeneous or an approximately homogeneous doping concentration. Optionally, there is the possibility of varying the effective doping concentration of the drift zone 14 in the current flow direction, to be precise in particular such that the drift zone 14 has a section in which the effective doping concentration increases continuously in the direction of the later drain zone 12. A doping concentration varying in this way can be achieved, referring to FIG. 9B, for example by virtue of the fact that, using the field plate dielectric 32 and the continuously increasing transition region 33 as a mask, dopant atoms of a conduction type complementary to the doping type of the drift zone 14 are implemented with a penetration depth in the region of the thickness d2 of the field plate dielectric 32. In this case, the dopant atoms are implanted through the dielectric layer into the drift zone 14, wherein the quantity of implanted dopant atoms decreases as the thickness of the dielectric layer 30 increases. As a result, fewer dopant atoms pass into regions of the drift zone which are covered by the field electrode dielectric 32 than into those regions which are not covered by the dielectric layer 30 or which are covered by the transition region 33 which increases in terms of its thickness. The dopant atoms complementary to the doping type of the drift zone 14 constitute a counterdoping, such that the effective doping concentration of the drift zone 14 is reduced to a greater extent in those regions into which a higher dose of complementary dopant atoms is implanted than in those regions into which a lower dose of the complementary dopant atoms is implanted. In the region of the transition region 33, the implanted dose decreases continuously in the direction of the later drain zone 12 on account of the increasing thickness of the transition region, such that ultimately the effective doping concentration of the drift zone 14 increases continuously below the transition region. In another exemplary embodiment, dopant atoms of the same conduction type as dopant atoms of the drift zone are implanted with a penetration depth in the region of the thickness d2 of the field plate dielectric 32. This results in a drift zone having a doping concentration which decreases in the direction of the later drain zone.

Before or after the production of the drift zone, a RESURF zone can be produced by ion implantation, this zone extending below the drift zone 14 along the drift zone 14 and being doped complementarily to the drift zone 14.

The dielectric layer 30 firstly completely covers the active region 110. Depending on the way in which the dielectric layer 30 is produced, the dielectric layer 30 can also cover the insulation region 120, as is illustrated in FIG. 9C. The dielectric layer 30 covers the insulation region 120 for example when the dielectric layer 30 is produced by means of a deposition method. The dielectric layer 30 could also be realized as a thermal oxide layer and in this case would be produced by thermal oxidation of the first surface 101 of the semiconductor body 100. In this case, the surface of the insulation region 30 would not be oxidized, and so the dielectric layer 30 in this case does not cover the insulation region 120. However, the gate and field electrode 20 explained below extends in any case in the region of the drain zone 12 beyond the active transistor region 110 to above the insulation region 120.

Figure 9D:
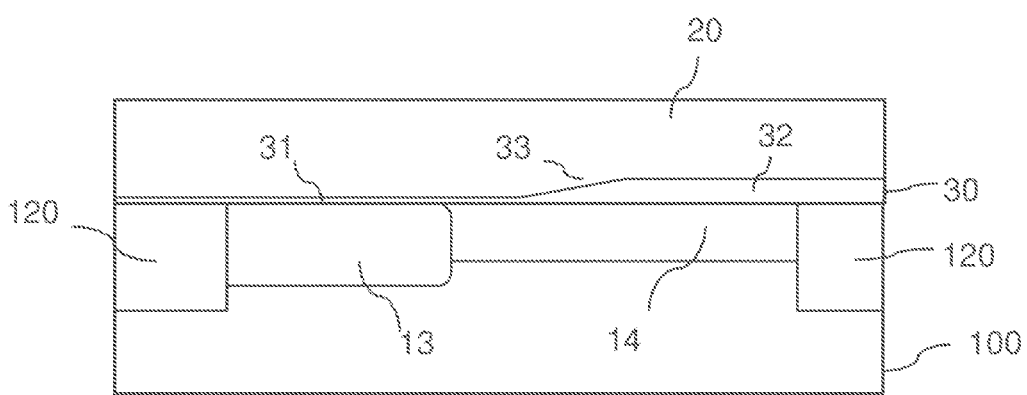

Referring to FIG. 9D, this gate and field electrode 20 is produced on the dielectric layer 30, to be precise such that it firstly completely covers the active transistor region 110 above the dielectric layer 30 and that it—independently of whether the dielectric layer 30 is also arranged on the insulation region 120—overlaps the insulation region 120, i.e., is also arranged above the insulation region 120. The gate and field electrode 20 can consist of a conventional electrode material for producing gate electrodes and field electrodes, such as, for example, of a highly doped polycrystalline semiconductor material such as polysilicon, for example. The gate and field electrode 20 is produced by means of a deposition process, for example.

Figure 9E:
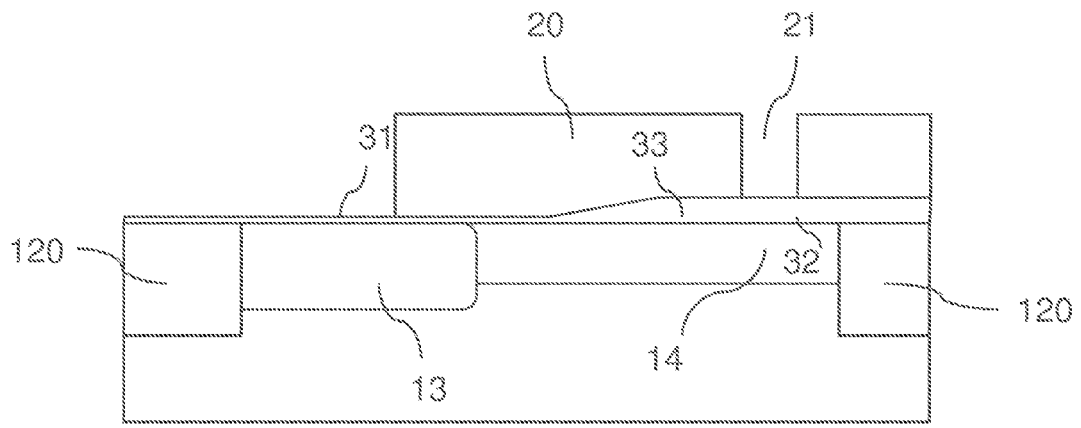

Referring to FIG. 9E, the first contact hole 21 is subsequently produced in the gate and field electrode 20. This contact hole or contact opening 21 is produced, for example, by means of an etching process, in particular an anisotropic etching process using an etching mask (not illustrated in FIG. 9E). The etching method for producing the first contact opening 21 is chosen, for example, such that it etches the material of the gate and field electrode 20 selectively with respect to the material of the dielectric layer 30, with the result that the dielectric layer 30 is initially still present at the bottom of the first contact opening 21. Referring to FIG. 1C, the dimensions of the first contact opening 21 are chosen, for example, such that the contact opening is spaced apart in a horizontal direction in each case from the insulation region 120, that is to say does not overlap the insulation region 120. The gate and field electrode 20 can be produced, for example, such that it firstly completely covers the body zone 13, and that it is subsequently removed again above parts of the body zone 13.

Figure 9F:
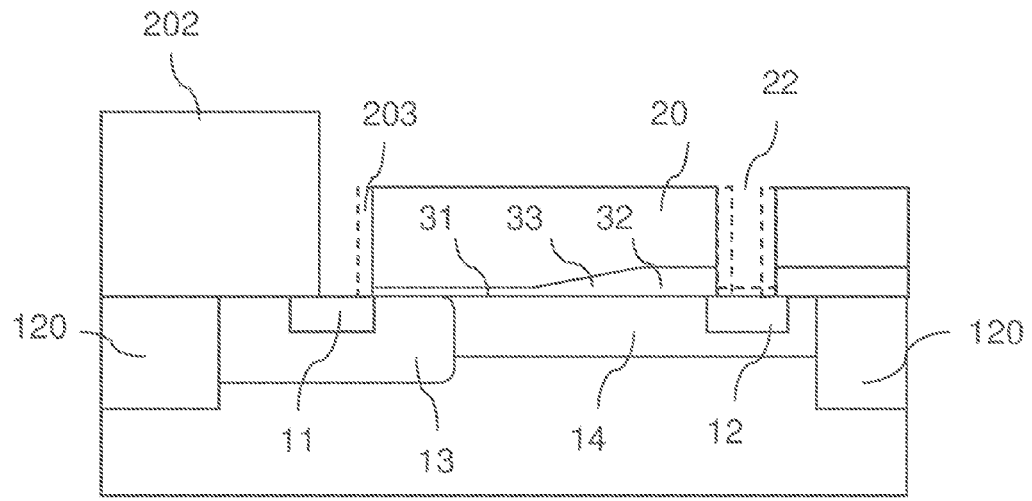

In next method steps, the result of which is illustrated in FIG. 9F, the source zone 11 and the drain zone 12 are produced. For this purpose, the dielectric layer 30 is removed completely where it is exposed above the body zone 13. The removal of the dielectric layer 30 comprises an anisotropic etching method, for example, which is chosen such that it etches the material of the dielectric layer 30 selectively with respect to the semiconductor material of the semiconductor body 100 and selectively with respect to the electrode material of the gate and field electrode 20. At the same time, the dielectric layer 30 is also etched at the bottom of the first contact opening 21. Since the dielectric layer 30 has the smaller first thickness d1 above the body zone 13 and the larger second thickness d2 at the bottom of the first contact opening 21, during the etching method at a point in time at which the dielectric layer 30 has already been completely removed above the body zone, a residual layer of the dielectric layer 30 is still present at the bottom of the first contact opening 21. There is thus the possibility either of carrying out the etching method until the dielectric layer 30 has been removed above the body zone 13 and at the bottom of the first contact opening 21, or of controlling the etching method such that the dielectric layer 30 is removed above the body zone 13, while a portion of the dielectric layer 30 still remains at the bottom of the first contact opening 21. This portion of the dielectric layer 30 which optionally remains at the bottom of the first contact opening 21 is illustrated by dashed lines in FIG. 9F.

Referring to FIG. 9F, the production of the source zone 11 comprises producing a mask layer 202, which covers the exposed body layer 13 in sections. In the case of the exemplary embodiment illustrated in FIG. 9F, the region of the body zone 13 covered by the mask layer 202 is a region situated in the direction of the insulation region 120, or a region situated in a region of the first contact opening 21 which faces away from the drift zone 14.

The production of the source zone 11 and of the drain zone 12 additionally comprises introducing dopant atoms into the body zone 13 and the drift zone 14, respectively. In this case, dopant atoms are introduced into the body zone 13 into the region left free by the mask 202. If a portion of the dielectric layer 30 is still present at the bottom of the second contact opening 22, the dopant atoms are implanted into the drift zone 14 through this remaining portion of the dielectric layer 30. The dopant atoms introduced are subsequently activated by thermal treatment.

In accordance with one exemplary embodiment, provision is made for carrying out, at least in order to produce the source zone 11, two implantations, namely a shallow implantation, also designated as LDD implantation, and a deep implantation with a high dose, also designated as HDD implantation. At least before the HDD implantation, a spacer 203 is applied to the sidewall of the gate and field electrode 20 in order to set the distance between the highly doped region and the later channel zone. In one method, a first spacer is already produced before the LDD implantation and then a second spacer is produced on the first spacer before the HDD implantation. Corresponding spacers can also be produced in the first contact hole 21.

Figure 9G:
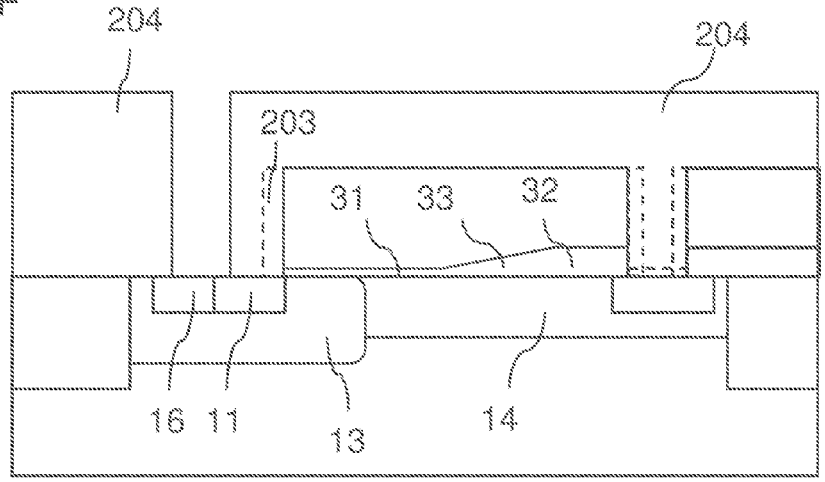

Referring to FIG. 9G, the optional contact zone 16 is produced in the body zone 13. For this purpose, a mask 204 is produced, which completely fills the first contact opening 21 and which leaves free only those regions of the body zone 13 into which dopant atoms are intended to be implanted for producing the contact zone 16.

The dopant atoms implanted for producing the contact zone 16 are subsequently activated by thermal treatment in order thereby to produce the contact zone 16. In this connection, it should be pointed out that the dopant atoms implanted for producing the source zone 11 and the drain zone 12 and the dopant atoms implanted for producing the contact zone 16 can be activated by a common thermal treatment, such that, for example, the source zone 11 and the drain zone 12 in the method steps illustrated in FIG. 9F arise only after the production step illustrated in FIG. 9G has been carried out.

When producing an IGBT, the drain zone 12 is produced by joint implantation during the production of the contact zone 16, such that the first contact opening 21 is completely covered by a mask during the production of the source zone.

Figure 9H:
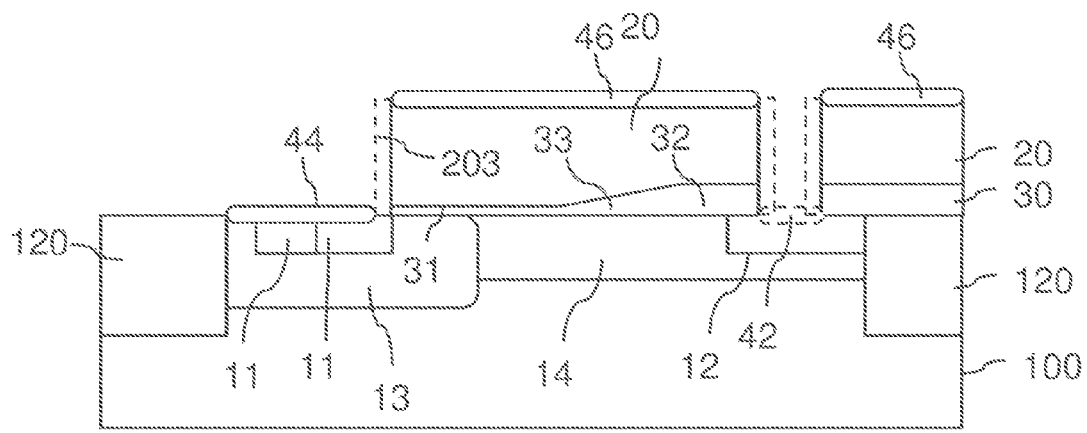

After the production of the source zone 11, the drain zone 12 and the contact zone 16 and after the removal of the mask 204, referring to FIG. 9H a contact electrode 44 is produced. The contact electrode 44 is for example a metal-semiconductor compound, such as cobalt silicide, for example. This silicide can be produced in a self-aligned manner as a so-called salicide (self-aligned silicide) in those regions in which the source zone 11 and the contact zone 16 are exposed.

For this purpose, the metal is applied to the surface over the whole area by sputtering, for example. In a thermal step, part of the metal situated on silicon combines therewith to form silicide. Afterward, in a wet-chemical process, the unreacted metal will be removed selectively with respect to the reacted silicide and the other uncovered layers of the preprocessing (generally silicon oxide).

If the dielectric layer 30 was completely removed at the bottom of the first contact opening 21, a contact electrode 42 is also produced at the bottom of the first contact opening 21 by the same process by which the contact electrode 44 is produced. If a residual layer of the dielectric layer 30 is present at the bottom of the first contact opening 21 (illustrated by dashed lines in FIG. 9G), the production of such a contact electrode 42 in the first contact opening 21 does not take place.

By the same process by which the contact electrode 44 of the source zone 11 is produced, a contact electrode 46 is also produced on the gate and field electrode 20, to be precise on all exposed regions of the gate and field electrode 20.

Figure 9I:
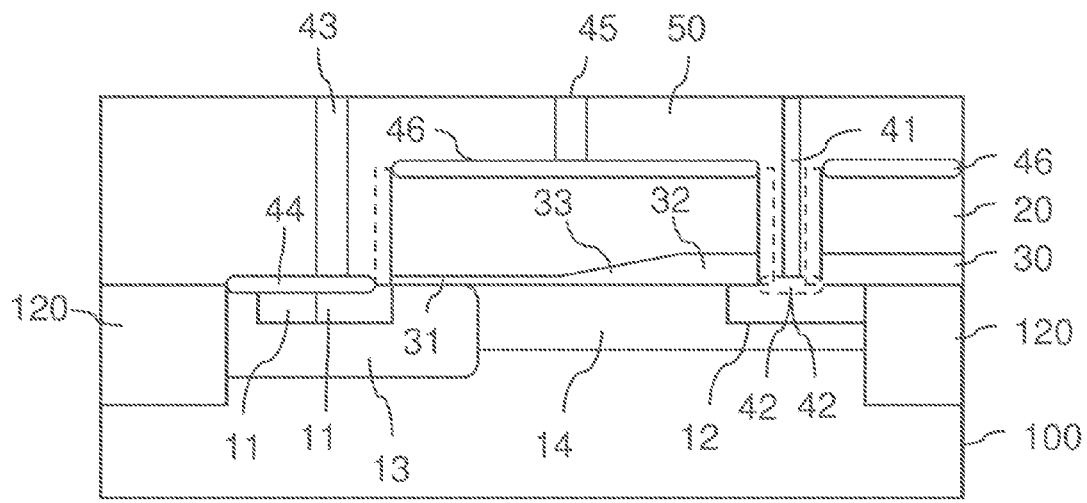

Referring to FIG. 9I, the source electrode 43, the drain electrode 41 and the gate connection electrode 45 are subsequently introduced. This is done, for example, by firstly depositing the insulation layer 50 over the whole area and subsequently etching contact openings above the contact electrodes 41, 45 of the source and body zones 11, 13 and respectively the gate and field electrode 20 and above the drain zone 12 into the insulation layer, into which an electrode material, such as metal, for example, is subsequently introduced.

The residual layer of the dielectric layer 30 that is optionally still present at the bottom of the first contact opening 21 is removed before the contact electrode 42 is produced, and if appropriate also before the insulation layer 50 is produced.

In order to produce a component in accordance with FIGS. 2A to 2C, the method can be modified in a simple manner by producing above the body zone 13 the second contact opening 22 in the gate and field electrode 20, instead of exposing the body zone 13 there as far as the insulation region 120.

A method for producing a dielectric layer 30 having a transition region 33 in which the thickness increases continuously is explained below with reference to FIGS. 10A to 10E. It should be pointed out that this method is not restricted to being used for the production of a dielectric layer in a lateral transistor component.

Referring to FIG. 10A, the method provides for producing a dielectric layer 30 on a semiconductor body 100 and a first mask layer 301 on the dielectric layer 30. The dielectric layer 30' is an oxide layer, for example, which can be produced by a deposition process or by thermal oxidation. The first mask layer 301 is, for example, oxide from production by an RTCVD method or TEOS. The etching rate is increased compared with thermal or densified oxide.

Referring to FIG. 10B, subsequently a second mask layer 302 is produced and the first mask layer 301 and the dielectric layer 30' are removed, for example by means of an anisotropic etching method, in those regions which are left free by the second mask layer 302. This gives rise to a layer stack comprising the dielectric layer 30, the first mask layer 301 and the second mask layer 302, wherein the dielectric layer 30 and the first mask layer 301 are exposed on one side of the layer stack.

Afterward, an isotropic etching process is carried out, which etches the dielectric layer 30 and the first mask layer 301, but not the second mask layer 302. The dielectric layer 30, the first mask layer 301 and the etching process are coordinated with one another such that the first mask layer 301 is etched with a higher etching speed (etching rate) than the dielectric layer 30. The ratio between the etching rate at which the dielectric layer 30 is etched and the etching rate at which the mask layer 301 is etched is between 1:3 and 1:5, for example.

The different etching rates have the effect that, at the beginning of the etching process, the mask layer 301 is etched more rapidly in the horizontal direction than the dielectric layer 30. As a result, a horizontally running section of the dielectric layer 30 is exposed by the mask layer 301, in which section the dielectric layer 30 is then likewise etched. This is illustrated during two different stages of the etching method in FIGS. 10C and 10D. If the etching method is continued until, by means of the etching process, the dielectric layer 30 is etched back at the edge, i.e., in the region which was exposed after the production of the layer stack, downward as far as the semiconductor body 100, an obliquely running edge of the dielectric layer 30 arises. After this obliquely running edge has been produced, the first mask layer 301 and the second mask layer 302 are removed, the result of which is illustrated in FIG. 10E. The result is a dielectric layer 30 having a transition region which increases continuously in terms of its thickness and which can be used as a transition region 33 in the lateral transistor component explained above, and having a section in which the thickness of the dielectric layer 30 was not reduced, which section can be used as a field plate dielectric 32 in the component explained above. The gate dielectric 31 can be produced by an additional deposition or oxidation process.

What is claimed is:

1. A transistor component comprising:
   an active transistor region arranged in a semiconductor body;
   an insulation region disposed adjacent the active transistor region in the semiconductor body;
   a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone;
   a gate electrode arranged above the active transistor region and insulated from the active transistor region by a dielectric layer, the dielectric layer having a first thickness in a first region near the body zone and having a second thickness in a second region near the drift zone, the second thickness being greater than the first thickness, wherein the dielectric layer has a transition region in which a thickness of the dielectric layer changes from the first thickness to the second thickness, and wherein the transition region overlaps with the drift zone; and a drain electrode making contact with the drain zone through a first contact opening in the gate electrode.

2. The transistor component as claimed in claim 1, wherein the gate electrode has a second contact opening above the source zone and wherein the gate electrode completely covers the active transistor region outside the first contact opening and the second contact opening.

3. The transistor component as claimed in claim 1, wherein the gate electrode completely covers the drift zone outside the first contact opening.

4. The transistor component as claimed in claim 1, wherein the gate electrode overlaps the insulation region in a region near the drain zone.

5. The transistor component as claimed in claim 1, wherein the drain zone is disposed within the drift zone, and wherein the drift zone contacts the insulation region in a region near the drain zone.

6. The transistor component as claimed in claim 1, wherein the drain zone is spaced apart from the insulation region.

7. The transistor component as claimed in claim 1, wherein the insulation region surrounds the active transistor region in a ring-shaped manner.

8. The transistor component as claimed in claim 1, wherein the first thickness is less than 40 nm, and wherein the second thickness is less than 500 nm.

9. The transistor component as claimed in claim 8, wherein the first thickness is between 5 nm and 40 nm, and wherein the second thickness is between 20 nm and 500 nm.

10. The transistor component as claimed in claim 1, further comprising a source electrode, wherein the source zone and the body zone are electrically connected to the source electrode.

11. The transistor component as claimed in claim 10, wherein a contact electrode is arranged between the source electrode and the source zone and the body zone.

12. The transistor component as claimed in claim 11, wherein the contact electrode comprises a metal-semiconductor compound.

13. The transistor component as claimed in claim 10, wherein a contact electrode is arranged between the drain electrode and the drain zone.

14. The transistor component as claimed in claim 13, wherein the contact electrode comprises a metal-semiconductor compound.

15. The transistor component as claimed in claim 1, wherein the drift zone has a section in which an effective doping concentration of the drift zone increases or decreases continuously in the direction of the drain zone.

16. The transistor component as claimed in claim 1, wherein the insulation region comprises an STI region or a LOCOS region.

17. The transistor component as claimed in claim 1, further comprising a second source zone, wherein the source zone and the second source zone are arranged symmetrically with respect to the drain zone, wherein the drain zone is common to the source zone and the second source zone.

18. A transistor component comprising:
an active transistor region arranged in a semiconductor body;
an insulation region disposed adjacent the active transistor region in the semiconductor body;
a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone; and
a gate electrode arranged above the active transistor region and insulated from the active transistor region by a dielectric layer, the dielectric layer having a first thickness in a first region near the body zone and having a second thickness in a second region near the drift zone, the second thickness being greater than the first thickness, wherein the dielectric layer has a transition region in which a thickness of the dielectric layer changes from the first thickness to the second thickness, and wherein the transition region overlaps with the drift zone, wherein the transition region comprises a plurality of steps of increasing thickness of the dielectric layer or wherein the transition region comprises a third region of the dielectric layer having a slanted top surface joining a top surface of the dielectric layer in the first region to a top surface of the dielectric layer in the second region.

19. The transistor component as claimed in claim 18, wherein the transition region comprises the third region of the dielectric layer having the slanted top surface joining the top surface of the dielectric layer in the first region to the top surface of the dielectric layer in the second region.

20. The transistor component as claimed in claim 19, wherein the angle of inclination of the dielectric layer in the transition region is between 5° and 60° relative to the side of the semiconductor body.

21. The transistor component hence claimed in claim 19, wherein the angle of inclination of the dielectric layer in the transition region is between 20° and 40° relative to the side of the semiconductor body.

22. The transistor component as claimed in claim 18, wherein the transition region comprises the plurality of steps of increasing thickness of the dielectric layer.

23. A transistor component comprising:
an active transistor region arranged in a semiconductor body;
an insulation region disposed adjacent the active transistor region in the semiconductor body;
a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone; and
a gate electrode arranged above the active transistor region and insulated from the active transistor region by a dielectric layer, the dielectric layer having a first thickness in a first region near the body zone and having a second thickness in a second region near the drift zone, the second thickness being greater than the first thickness, wherein the dielectric layer has a transition region in which a thickness of the dielectric layer changes from the first thickness to the second thickness, wherein the transition region overlaps with the drift zone, wherein the active transistor region has an edge at which the active transistor region adjoins the insulation region, and wherein the gate electrode overlaps the edge in a region of the drain zone.

24. The transistor component as claimed in claim 23, wherein the gate electrode overlaps the insulation region in a region near the drain zone.

25. A transistor component comprising:
an active transistor region arranged in a semiconductor body;

an insulation region disposed adjacent the active transistor region in the semiconductor body;

a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone;

a gate electrode arranged above the active transistor region and insulated from the active transistor region by a dielectric layer, the dielectric layer having a first thickness in a first region near the body zone and having a second thickness in a second region near the drift zone, the second thickness being greater than the first thickness, wherein the dielectric layer has a transition region in which a thickness of the dielectric layer changes from the first thickness to the second thickness, wherein the transition region overlaps with the drift zone; and a field electrode integrated with the gate electrode as a continuous electrode.

26. A transistor component comprising:

an active transistor region arranged in a semiconductor body;

an insulation region disposed adjacent the active transistor region in the semiconductor body;

a source zone, a drain zone, a body zone and a drift zone in the active transistor region, wherein the source zone and the drain zone are spaced apart in a lateral direction of the semiconductor body and the body zone is arranged between the source zone and the drift zone, and the drift zone is arranged between the body zone and the drain zone; and a gate electrode arranged above the active transistor region and insulated from the active transistor region by a dielectric layer, the dielectric layer having a first thickness in a first region near the body zone and having a second thickness in a second region near the drift zone, the second thickness being greater than the first thickness, wherein the dielectric layer has a transition region in which a thickness of the dielectric layer changes from the first thickness to the second thickness, and wherein the transition region overlaps with the drift zone; and a second source zone, wherein the source zone and the second source zone are arranged symmetrically with respect to the drain zone, wherein the drain zone is common to the source zone and the second source zone.

* * * * *